(12) United States Patent
Rapisarda

(10) Patent No.: US 9,978,806 B1
(45) Date of Patent: May 22, 2018

(54) THREE LEAD RGB LED

(71) Applicant: Carmen Rapisarda, Apple Valley, CA (US)

(72) Inventor: Carmen Rapisarda, Apple Valley, CA (US)

(*) Notice: Subject to any disclaimer, the term of this patent is extended or adjusted under 35 U.S.C. 154(b) by 0 days. days.

(21) Appl. No.: 14/275,078

(22) Filed: May 12, 2014

Related U.S. Application Data

(60) Provisional application No. 61/824,542, filed on May 17, 2013.

(51) Int. Cl.
*H05B 33/08* (2006.01)
*H01L 27/15* (2006.01)

(52) U.S. Cl.
CPC .................................. *H01L 27/15* (2013.01)

(58) Field of Classification Search
CPC ........................ H05B 33/0857; H05B 33/0818
See application file for complete search history.

(56) References Cited

U.S. PATENT DOCUMENTS

| | | | | |
|---|---|---|---|---|
| 2008/0079019 A1* | 4/2008 | Huang | ................... | H01L 33/483 257/99 |
| 2009/0316389 A1* | 12/2009 | Park | .................. | G02F 1/133603 362/97.1 |
| 2012/0146505 A1* | 6/2012 | Jonsson | ............. | H05B 33/0857 315/50 |
| 2012/0224374 A1* | 9/2012 | Aliberti | .............. | H05B 33/0803 362/249.02 |
| 2014/0313713 A1* | 10/2014 | Andrews | ................. | F21S 4/001 362/235 |

* cited by examiner

Primary Examiner — Peniel M Gumedzoe
Assistant Examiner — Christopher Johnson
(74) *Attorney, Agent, or Firm* — Roy L. Anderson

(57) ABSTRACT

An RGB LED uses three leads instead of four. The three RGB semiconductor chips are all connected to a common lead where they are held. One of the three RGB semiconductor chips is connected, in conventional fashion, to a second lead. The other two of the three RGB semiconductor chips are alternately connected to a third lead and wired so that only one will work at a time, depending upon whether a positive or negative current is applied. A controller controls the direct and alternating current applied to the three RGB semiconductor chips to produce the desired combined color for the RGB LED.

15 Claims, 2 Drawing Sheets

THREE LEAD RGB LED

CROSS-REFERENCE TO RELATED APPLICATIONS

This application claims priority from U.S. 61/824,542, filed May 17, 2013, the disclosure of which is specifically incorporated herein by reference in its entirety.

FIELD OF THE INVENTION

The present invention is in the field of RGB LEDs and also in the fields of products that use RGB LEDs, such as screen displays and bulbs.

BACKGROUND OF THE INVENTION

A RGB LED is a light emitting diode (LED) that relies upon the mixing of red, green and blue (RGB) to produce white light. RGB LEDs available today use a red chip, a green chip and a blue chip and have four output leads.

SUMMARY OF THE INVENTION

The present invention is generally directed to an RGB LED that uses three leads instead of four. The three RGB semiconductor chips are all connected to a common lead where they are held. One of the three RGB semiconductor chips is connected, in conventional fashion, to a second lead. The other two of the three RGB semiconductor chips are alternately connected to a third lead and wired so that only one will work at a time, depending upon whether a positive or negative current is applied. A controller controls the direct and alternating current applied to the three RGB semiconductor chips to produce the desired combined color for the RGB LED.

Instead of creating an RGB LED, a multicolor LED, using three different semiconductor chips, each of which emits a different color of light, can be created using the same principles as the RGB LED with a controller appropriate for such multicolor LED. Also, multiple RGB or multicolor LEDs can be incorporated into assemblies such as lights, bulbs, display screens and other articles of manufacture.

Accordingly, it is a primary object of the present invention to provide an RGB LED that only has three leads, instead of four.

This and further objects and advantages will be apparent to those skilled in the art in connection with the drawings and the detailed description of the preferred embodiment set forth below.

BRIEF DESCRIPTION OF THE DRAWINGS

FIG. 2 illustrates a PCB with a plurality of RGB LEDs (such as is illustrated in FIG. 1) mounted to it while

DETAILED DESCRIPTION OF THE INVENTION

Figure 1:
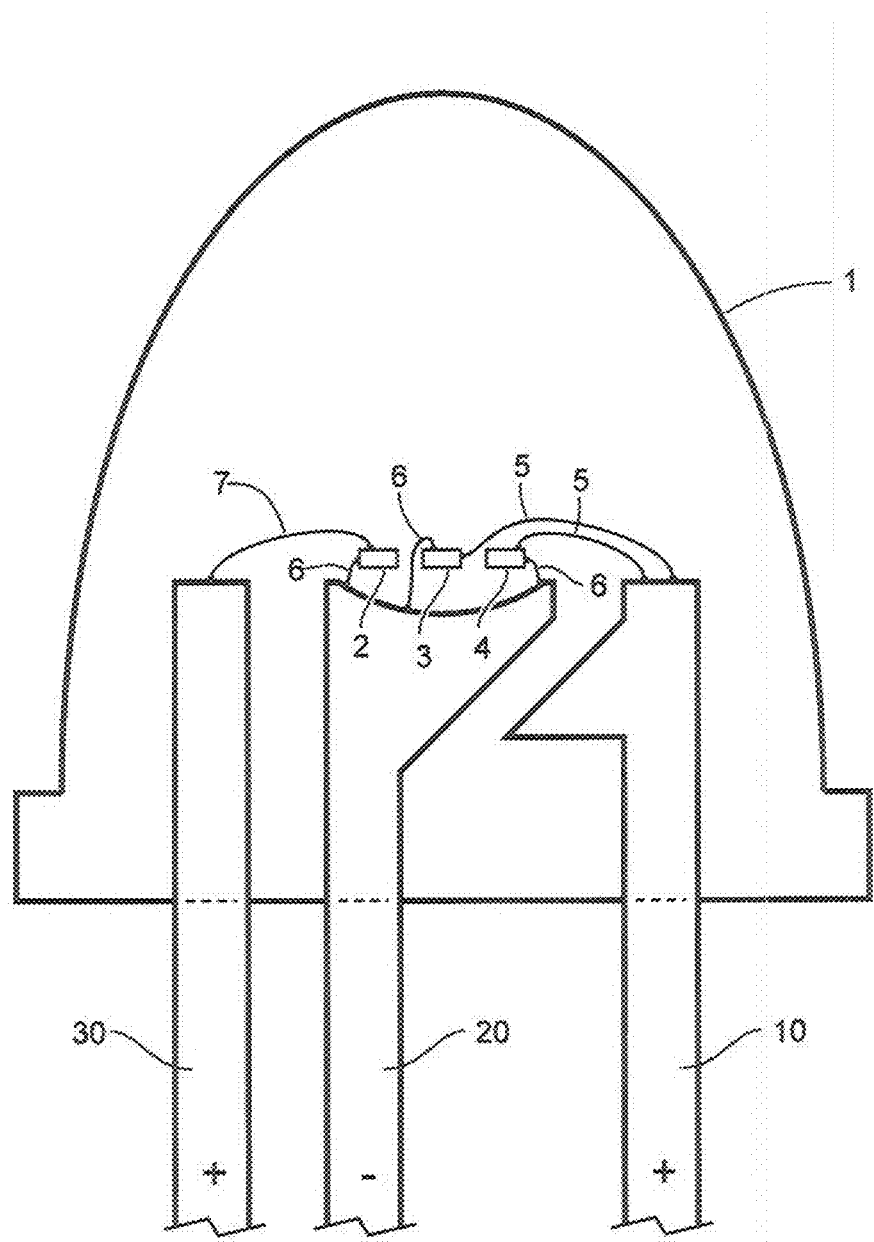
FIG. 1 is a schematic diagram illustrating a three lead RGB LED in accordance with the teachings of the present invention which only has three, as opposed to four, output leads extending out of the package in which three semiconductor chips are encapsulated.

FIG. 1 illustrates a three lead RGB LED 1 in accordance with the present invention. LED 1 has two positive or anode leads 10 and 30 and a negative or cathode lead 20. Three different semiconductor chips, 2-4, are assembled into LED 1, such as by mounting them on a support which may be a cup or anvil of lead 20. Each of the three different semiconductor chips 2-4 emits a different color of light; semiconductor chip 2 emits a red color, semiconductor chip 3 emits a green color while semiconductor chip 4 emits a blue color, at least as perceived by a human eye. Two of the three different semiconductor chips 2-4 is wire bonded to lead 10 by wire bonding 5 and to lead 20 by wire bonding 6, although they are wire bonded so as to only function with opposite polarity so that only one of them will emit light with a negative current while the other will emit light with a positive current. In this same example, if the current is alternated at a high enough frequency, the human eye will perceive the light emitted from the two semiconductor chips as a third color which represents the color addition of the two lights. The third semiconductor chip is wire bonded to lead 30 by wire bonding 7 and to lead 20 by wire bonding 6 and is driven by direct current in accordance with current methodology.

The three leads of REG LED 1 are electrically connected to a controller 12 which controls both the direct current to the single semiconductor chip operating on direct current (which is wire bonded to lead 30 in FIG. 1) and also the alternating current to the two semiconductor chips that are alternately wire bonded to lead 10 so that only one of them will emit light at a given point in time. The controller controls the current applied to all three semiconductor chips so that they produce a blended color as is done by current four lead RGB LEDs, without the necessity of the fourth lead, since now two semiconductor chips can share a common connection to lead 10. The controller can cause the plurality of multicolor LEDs to sequentially produce at least two or different visible colors of light over two different periods of time or three different visible colors of light over three different periods of time.

While FIG. 1 illustrates a red semiconductor chip 2 being connected to lead 30, it is not necessary that only a red semiconductor chip be so connected, and the order in which any of the three semiconductor chips 2-4 are connected to leads 10 and 30 can be varied.

An RGB LED 1 in accordance with the present invention can be used in the same applications and in the same fashion as existing RGB LEDs, except that it only requires three leads, which can lead to advantages in terms of reducing the size and cost of RGB LEDs. Accordingly, for example, RGB LEDs in accordance with the present invention can be used in LED-backlit LCD flat panel displays (e.g., televisions) or in RGB bulbs.

Figure 2:
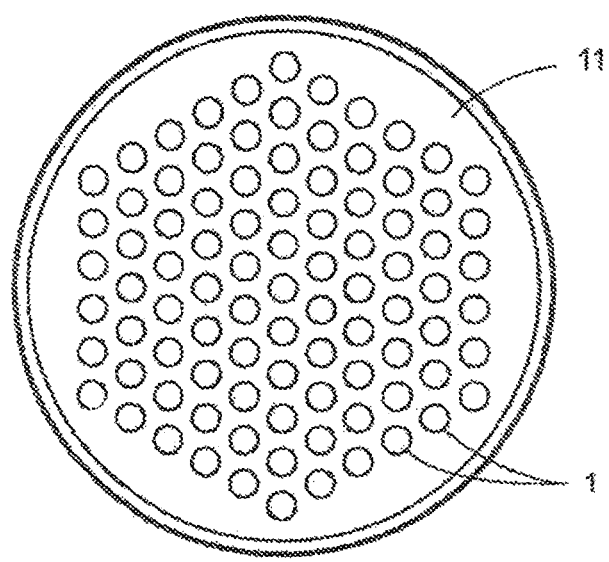

One or more RGB LEDs in accordance with the present invention can be connected to a printed circuit board (PCB) 11, an example of which is illustrated in FIG. 2, which may be a flex circuit. A controller can also be mounted to PCB 11, or it can be mounted in a different PCB 13 and electrically connected to PCB as is illustrated in FIG. 3.

Figure 3:
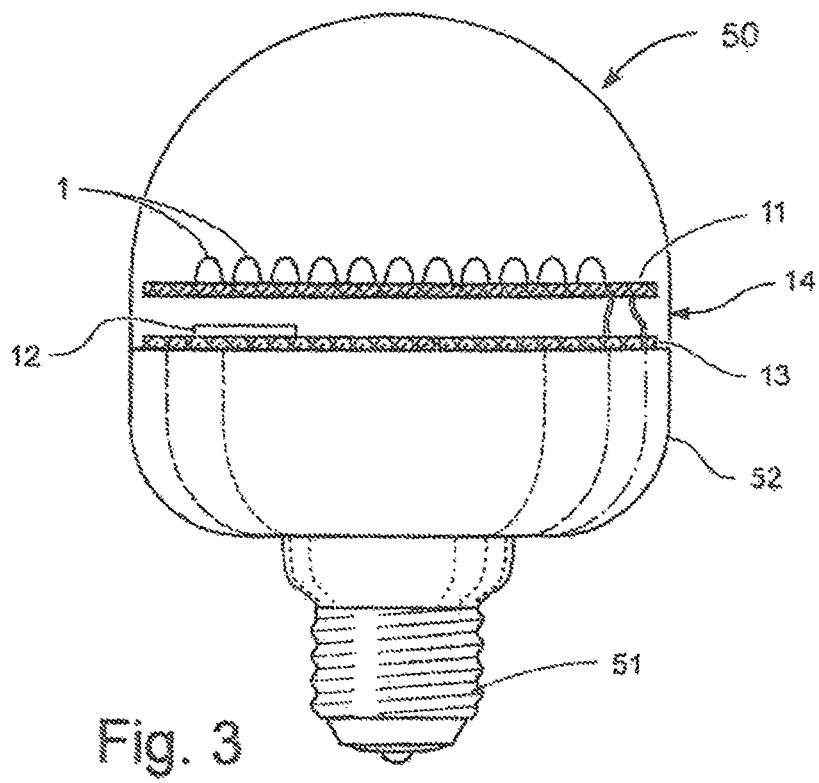
FIG. 3 illustrates a bulb in which the PCB of FIG. 2 is mounted and used.

FIG. 3 illustrates an RGB bulb 50 constructed using RGB LEDs according to the present invention. PCB 11 from FIG. 2 is mounted inside of a housing and electrically connected by electrical connections, shown generally as 14, to a second PCB 13 that contains controller 12 and all other electronics necessary for RGB bulb 50 to function. Base 52 of bulb 50 has a socket 51 for screwing into conventional socket sources, such as a lamp.

Although the foregoing detailed description is illustrative of preferred embodiments of the present invention, it is to be understood that additional embodiments thereof will be obvious to those skilled in the art. Further modifications are also possible in alternative embodiments without departing from the inventive concept.

Accordingly, it will be readily apparent to those skilled in the art that still further changes and modifications in the actual concepts described herein can readily be made without departing from the spirit and scope of the disclosed inventions.

What is claimed is:

1. A red, green and blue (RGB) light emitting diode (LED), comprising:
    a first lead, a second lead, and a third lead, wherein the first lead and the third lead have an identical polarity that is opposite the polarity of the second lead; and
    a first RGB semiconductor chip, a second RGB semiconductor chip and a third RGB semiconductor chip mounted to a support of the second lead, wherein the first RGB semiconductor chip and the second RGB semiconductor chip are bonded to the first lead and to the second lead so as to only function with opposite polarity so that only one of them will emit light with a negative current while the other of them will emit light with a positive current, while the third RGB semiconductor chip is bonded to the second lead and to the third lead;
    wherein each of the first RGB semiconductor chip, the second RGB semiconductor chip and the third RCB semiconductor chip emits a different color of light selected from the group consisting of a red color, a green color and a blue color;
    wherein the first, second and third leads extend outside of a single RGB LED package while the first, second and third RGB semiconductor chips are encapsulated within the single RGB LED package; and
    wherein the single RGB LED package is configured to produce a desired combined color without the need for a fourth lead when direct and alternating current are applied to the first, second and third lead.

2. A multicolor light emitting diode (LED), comprising:
    a first lead, a second lead, and a third lead, wherein the first lead and the third lead have an identical polarity that is opposite the polarity of the second lead; and
    a first semiconductor chip, a second semiconductor chip and a third semiconductor chip mounted to the second lead, wherein the first semiconductor chip and the second semiconductor chip are bonded to the first lead and to the second lead so as to only function with opposite polarity so that only one of them will emit light with a negative current while the other of them will emit light with a positive current, while the third semiconductor chip is bonded to the second lead and to the third lead;
    wherein the first semiconductor chip, the second semiconductor chip and the third semiconductor chip each emit a different color of light;
    wherein the first, second and third leads extend outside of a single RCB LED package while the first, second and third RGB semiconductor chips are encapsulated within the single RCB LED package; and
    wherein the single RGB LED package is configured to produce a desired combined color without the need for a fourth lead when direct and alternating current are applied to the first, second and third leads.

3. The multicolor LED of claim 2, wherein the desired color is a blend of at least two different colors of light.

4. The multicolor LED of claim 2, wherein the desired color is a blend of at least three different colors of light.

5. An apparatus, comprising:
    a plurality of multicolor light emitting diodes (LEDs) mounted to a substrate, each of the plurality of multicolor LEDs comprising:
        a first lead, a second lead, and a third lead, wherein the first lead and the third lead have an identical polarity that is opposite the polarity of the second lead;
        a first semiconductor chip, a second semiconductor chip and a third semiconductor chip mounted to the second lead,
        wherein the first semiconductor chip and the second semiconductor chip are bonded to the first lead and to the second lead so as to only function with opposite polarity so that only one of them will emit light with a negative current while the other of them will emit light with a positive current, while the third semiconductor chip is bonded to the second lead and to the third lead; and
        wherein the first semiconductor chip, the second semiconductor chip and the third semiconductor chip each emit a different color of light;
        wherein the first, second and third leads extend outside of a single RGB LED package while the first, second and third RGB semiconductor chips are encapsulated within the single RGB LED package; and
        wherein the single RGB LED package is configured to produce a desired combined color without the need for a fourth lead when direct and alternating current are applied to the first, second and third leads; and
    a controller that is electrically connected to each of the first, the second and the third leads of each of the plurality of multicolor LEDs and which controls direct and alternating current applied to the first, the second and the third semiconductor chips of each of the plurality of multicolor LEDs to produce a desired color for each of the plurality of multicolor LEDs.

6. The apparatus of claim 5, wherein each of the plurality of multicolor LEDs is a red, green and blue ("RGB") LED.

7. The apparatus of claim 6, wherein the apparatus is an LED-backlit liquid crystal display flat panel display.

8. The apparatus of claim 6, wherein the apparatus is an RGB bulb.

9. The apparatus of claim 6, wherein the substrate is a circuit board.

10. The apparatus of claim 9, wherein the circuit board is a printed circuit board.

11. The apparatus of claim 9, wherein the circuit board is a flex circuit.

12. The apparatus of claim 9, wherein the controller is mounted to a second circuit board.

13. The apparatus of claim 12, wherein the circuit board and the second circuit board are mounted inside a housing of an RGB bulb.

14. The apparatus of claim 5, wherein the controller can cause the plurality of multicolor LED packages to sequentially produce at least two different visible colors of light over two different periods of time.

15. The apparatus of claim 5, wherein the controller can cause the plurality of multicolor LED packages to sequentially produce at least three different visible colors of light over three different periods of time.

* * * * *